United States Patent
Liu

(10) Patent No.: US 8,245,010 B2
(45) Date of Patent: Aug. 14, 2012

(54) METHOD FOR MEMORY ADDRESS ARRANGEMENT

(75) Inventor: Shang-I Liu, Kaohsiung (TW)

(73) Assignee: Novatek Microelectronics, Hsinchu (TW)

(*) Notice: Subject to any disclaimer, the term of this patent is extended or adjusted under 35 U.S.C. 154(b) by 399 days.

(21) Appl. No.: 11/863,642

(22) Filed: Sep. 28, 2007

(65) Prior Publication Data
US 2009/0006807 A1  Jan. 1, 2009

(30) Foreign Application Priority Data
Jun. 29, 2007 (TW) ................ 96123772 A

(51) Int. Cl.
  *G06F 12/00* (2006.01)
  *G06F 9/34* (2006.01)
  *G06F 9/26* (2006.01)

(52) U.S. Cl. ...................................... 711/200; 711/202
(58) Field of Classification Search .................. 711/200
  See application file for complete search history.

(56) References Cited

U.S. PATENT DOCUMENTS 4,893,273 A * 1/1990 Usami ...................... 365/185.04
6,151,656 A * 11/2000 Mashima et al. ................. 711/5

* cited by examiner

*Primary Examiner* — Yaima Campos
*Assistant Examiner* — Hamdy S Ahmed
(74) *Attorney, Agent, or Firm* — J.C. Patents

(57) ABSTRACT

A method for memory address arrangement is provided. Data of different Y coordinates is moved to operation units divided by different X coordinates, or data of different X coordinates is moved to operation units divided by different Y coordinates, so as to realize the function of simultaneously longitudinally and laterally reading and writing a plurality of batches of data, thereby preventing the limitation of only longitudinally or laterally reading and writing a plurality of batches of data.

16 Claims, 6 Drawing Sheets

METHOD FOR MEMORY ADDRESS ARRANGEMENT

CROSS-REFERENCE TO RELATED APPLICATION

This application claims the priority benefit of Taiwan application serial no. 96123772, filed on Jun. 29, 2007. All disclosure of the Taiwan application is incorporated herein by reference.

BACKGROUND OF THE INVENTION

1. Field of the Invention

The present invention relates to a method for address arrangement. More particularly, the present invention relates to a method for memory address arrangement.

2. Description of Related Art

As science and technology change quickly, memory develops towards a trend of larger capacity and quicker access speed in correspondence with storage of a large amount of data. The access speed is more required as the memory capacity is larger, and the quicker speed means the higher writing and reading frequency. It is well known that the operation of the memory is mainly writing and reading, so the frequency of writing and reading determines the operating frequency. Therefore, the operating frequency of the memory with large capacity is usually too high to be lowered, such that the minimum value of the operating frequency of the system is limited, which brings higher limitations or requirements to the configuration of other hardware and software of the system. Therefore, it becomes an important technical issue how to lower the access frequency of the memory while keeping or even improving the access speed.

A conventional method is to realize an architecture capable of writing or reading a plurality of units at a time for the memory, in which the memory is divided into several units capable of being respectively reading and writing, and each unit reads and writes an address, thereby achieving a result of reading and writing a plurality of sets of data at a time. For the ease of illustration, the memory is, for example, divided into four units hereinafter. FIG. 1 is a related schematic block diagram of a memory being laterally divided. The memory is laterally divided into four sub blocks, namely sub blocks 101-104, and each sub block includes four longitudinal units represented by letters A-P. Each sub block reads and writes one address at a time, so the memory can read and write four lateral data at a time, for example, ABCD at the first time, EFGH at the second time, IJKL at the third time, and MNOP at the fourth time. In this manner, when it is required to finish the reading and the writing on the data with the same amount at a fixed time, as a plurality of batches of data can be simultaneously read and written at a time, the times of reading and writing can be lowered, and the operating frequency is lowered as well, thereby achieving the objective of improvement. However, in the method of the above example, the memory is laterally divided, so it is only allowed to read and write a plurality of lateral addresses at a time. If it is necessary to read and write a plurality of longitudinal addresses at a time, for example addresses to be read and write are AEIM, BFJN, CGKO, and DHLP, it can not be performed.

For the longitudinal dividing, it is feasible on theory, but practically, burden and limitation on the hardware configuration certainly will be increased, and the related cost is improved, so it is not quite feasible. Further, since it is possible to read and write a plurality of lateral addresses at a time, and the objective of lowering the operating frequency is achieved, is it necessary to further provide a function of reading and writing a plurality of longitudinal addresses at a time? On this point, a liquid crystal display (LCD) is taken as an example, usually a gate driver of the LCD is installed on a longitudinal side of the display panel, and a source driver is installed on a lateral side of the display panel. According to the architecture, the reading of the display memory address data is laterally performed in sequence, so the memory laterally divided can satisfy the requirement. However, as for the hardware configuration requirement, for example a rotatable panel design, the memory is connected to a panel having the source driver disposed laterally, when another function is used, the memory is connected to a panel having the source driver disposed longitudinally, so it is necessary to simultaneously read and write a plurality of batches of lateral data and a plurality of batches of longitudinal data, and thus the memory of the prior art is not available.

SUMMARY OF THE INVENTION

Accordingly, the present invention is directed to provide a method for memory address arrangement, which is capable of realizing a manner of simultaneously writing a plurality of batches of longitudinal data and a plurality of batches of lateral data, and preventing the limitation of only longitudinal or lateral writing.

The present invention is further directed to provide a method for memory address arrangement, which is capable of realizing a manner of simultaneously reading a plurality of batches of longitudinal data and a plurality of batches of lateral data, and preventing the limitation of only longitudinal or lateral reading.

The present invention provides a method for memory address arrangement. In this method, the data of different Y coordinates is moved to operation units divided by different X coordinates, or the data of different X coordinates is moved to operation units divided by different Y coordinates. The method includes firstly longitudinally dividing the memory into a plurality of blocks; then, writing the data from a first row of the plurality of blocks in sequence; and writing the data from a second row of the plurality of blocks in sequence. However, initial blocks of the two rows are different, but the present invention is not limited to only write two rows, and the key point lies in the moving technique applied between the writing periods of the rows.

In a preferred embodiment of the present invention, the method for memory address arrangement further includes reading the data from each row of the plurality of blocks in sequence, and the read address is determined according to the written address. Without repeating, when a number of the blocks is n, after at least n rows of data are written, two rows with the same initial block begin to appear (n is a natural number). At the same time, each block of the blocks writes and reads the data by means of one row at a time.

In a preferred embodiment of the present invention, the method for memory address arrangement further includes, for example, firstly writing the data from a first block of the first row in sequence, then writing the data from a second block of the second row in sequence, next writing the data from a third block of a third row in sequence, and finally writing the data from a fourth block of a fourth row in sequence, where the number of the blocks is four.

In a preferred embodiment of the present invention, the above manner includes the method of dividing the memory into several operation units to simultaneously starting a plurality of sets of data lines, together with an address converting mechanism, thereby realizing a capability of reading and writing the plurality of batches of lateral data and the plurality of batches of longitudinal data simultaneously.

In a preferred embodiment of the present invention, the written data is an image data, and the method for memory address arrangement has supreme performance on rotating image frames. Generally speaking, quite a few manufacturers rotate the image frames by means of software calculation, such that the processing speed is quite slow. However, in the present invention, when storing the data, the situation that all the data is stored from the same block is prevented, so when reading the frame, the data can be read laterally and longitudinally. At the same time, the present invention is suitable for processing a regular writing of a great amount of data. The memory suitable for the present invention can be a memory reading and writing the data in a manner of array, such as a static random access memory (SRAM), a dynamic random access memory (DRAM), and a flash memory.

In the present invention, the data of different Y coordinates of the memory is moved to the operation units divided by different X coordinates, so as to realize the manner of simultaneously reading and writing a plurality of batches of longitudinal and a plurality of batches of lateral data, and to prevent the limitation of only lateral reading and writing. Alternatively, the data of different X coordinates of the memory is moved to the operation units divided by different Y coordinates, so as to realize the manner of simultaneously reading and writing a plurality of batches of longitudinal and a plurality batches of lateral data, and to prevent the limitation of only longitudinal reading and writing. Therefore, the reading and writing of the memory become more flexible, and more diversified access modes are provided on the processing of the large amount of data, so as to satisfy more requirements of the system.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE-DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The feature of the convention art is to divide the memory into a plurality of operation units, so as to simultaneously read and write a plurality of batches of lateral data, but the disadvantage is that it is impossible to simultaneously read a plurality of batches of longitudinal data. Hereinafter, several embodiments of the present invention are described to illustrate the spirit and practical operating feasibility of the present invention.

In the present invention, a method of dividing the memory into several operation units to simultaneously start a plurality of sets of data lines is used, together with an address converting mechanism, so as to realize a capability of reading and writing the plurality of batches of lateral data and the plurality of batches of longitudinal data simultaneously.

The main method is that in a memory laterally and continuously reading and writing N batches of data, the positions of N batches (or more than N batches) of data required to be longitudinally read and written at a time are moved to different lateral operation units, so as to read and write the data longitudinally and continuously. In this method, the longitudinal addresses are moved to different operation units according to the Y coordinates. When reading or writing the data, the moving is realized by a data converter and a control signal, so as to satisfy the corresponding relation of memory internal address and external physical address. The main function of the data converter is to convert the data to be written from the external physical position to the corresponding position after the internal moving of the memory, and to convert the data to be read from the corresponding address after the internal moving to the external physical position during reading. This can be realized by a multi-to-multi multiplexer. The function of the control signal is to suitably change the X and Y axis addresses when reading and writing the signal. The change of the address must be performed together with the data converter, and the signal can be generated by the controller as in a third embodiment below, or can be converted by the sub block according to the input X and Y axis addresses as in a second embodiment below.

Definitely, the data converting mechanism is necessary for realizing the present invention, but this function can be also realized in the controller, and it is not necessary for the memory. In a memory longitudinally and continuously reading and writing N batches of data, the principle of the address converting manner is as described above, that is, the positions of N batches (or more than N batches) of data required to be laterally read and written at a time are moved to different longitudinal operation units.

Figure 1:
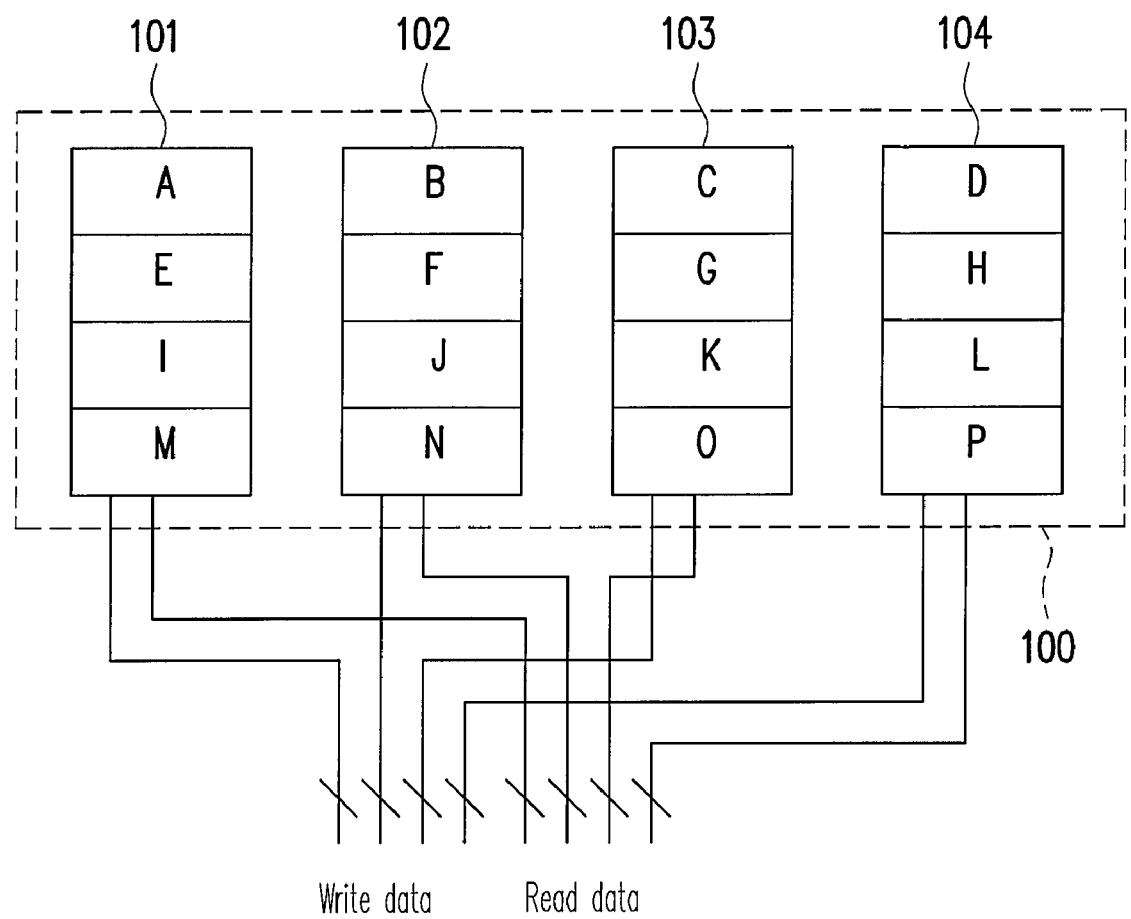
FIG. 1 is a related schematic block diagram of a memory laterally divided.
Figure 2:
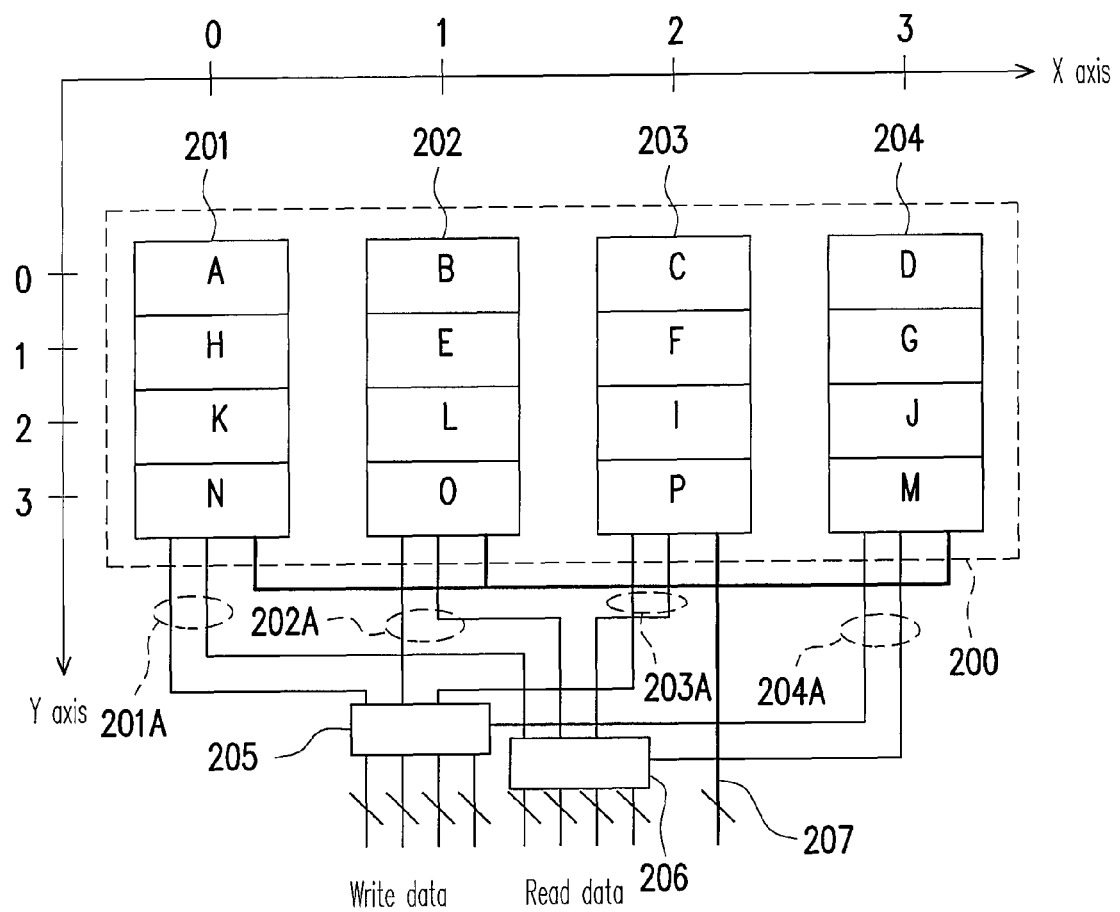
FIG. 2 is a related schematic view of the memory in FIG. 1 after the address converting mechanism is added.

Next, detailed description is given with examples. In the first embodiment, it is required to continuously read and write four batches of memory data laterally or longitudinally. In FIG. 2 of this embodiment, a related schematic view of the memory in FIG. 1 after the address converting mechanism is added is shown. A memory 200 is laterally divided into sub blocks 201-204, data addresses A-P are address units after the internal moving of the memory, and data lines 201A-204A are respectively address data lines for reading and writing the sub blocks. The main function of a data converter 205 is to convert the data to be written from the external physical position to the corresponding position after the internal moving of the memory. A data converter 206 converts the data to be read from the corresponding address after the internal moving to the external physical position during reading. This can be realized by a multi-to-multi multiplexer. The function of a control signal 207 is to change the addresses of the data to be read and written.

When it is required to continuously write four batches of lateral data ABCD, EFGH, IJKL, and MNOP, as the data to be laterally read and written at a time are at different sub blocks, so the function of writing four batches of lateral data is achieved.

However, among the four batches of data required to be laterally read and written at a time, i.e., ABCD, EFGH, IJKL, and MNOP, three batches of data have been moved to other sub blocks. Therefore, when the four batches of lateral data are written, through the data converter, the value of Y[1:0] (Y represents Y axis, [1:0] represents two bits, and Y[1:0] represents address Y coordinate value) is used to respectively move Y[1:0]=0 for 0 sub block, move Y[1:0]=1 for 1 sub block, move Y[1:0]=2 for 2 sub blocks, and move Y[1:0]=3 for 3 sub blocks, as shown in the operating method of the data converter in the following Table 1.

TABLE 1

| Y[1:0] | External original input or output address data | Address data after internal moving of memory |
|---|---|---|
| 00 | ABCD | ABCD |
| 01 | EFGH | HEFG |
| 10 | IJKL | KLIJ |
| 11 | MNOP | NOPM |

When it intends to continuously write four batches of longitudinal data AEIM, BFJN, CGKO, and DHLP, as the data to be longitudinally read and written at a time are at different sub blocks, the function of writing four batches of longitudinal data can be achieved.

For the four batches of data required to be longitudinally read and written at a time AEIM, BFJN, CGKO, and DHLP, through the data converter, the value of Y[1:0] is used to respectively move Y[1:0]=0 for 0 sub block, move Y[1:0]=1 for 1 sub block, move Y[1:0]=2 for 2 sub blocks, and move Y[1:0]=3 for 3 sub blocks, as shown in the operating method of the data converter in the Table 2.

TABLE 2

| Y[1:0] | External original input or output address data | Address data after internal moving of memory |
|---|---|---|
| 00 | AEIM | AEIM |
| 01 | BFJN | NBFJ |
| 10 | CGKO | KOCG |
| 11 | DHLP | HLPD |

Next, Table 3 and Table 3A-3C are used to illustrate a variety of possible combinations of position conversion, when the positions of the four batches (or more than four batches) of data required to be longitudinally read and written at a time are moved to different sub blocks, so as to longitudinally and continuously read and write the data. Thus, Table 3 only represents the arrangement of a certain part of the data, and any methods of rearranging the address to simultaneously read the plurality of longitudinal/lateral data are within the scope of the present invention.

TABLE 3

| A | B | C | D |
|---|---|---|---|
| A | B | C | D |
| A | B | C | D |
| A | B | C | D |
| A | B | C | D |
| A | B | C | D |

TABLE 3-continued

| A | B | C | D |
|---|---|---|---|
| A | B | C | D |
| A | B | C | D |

TABLE 3A

| A | B | C | D |
|---|---|---|---|
| D | A | B | C |
| C | D | A | B |
| B | C | D | A |
| A | B | C | D |
| D | A | B | C |
| C | D | A | B |
| B | C | D | A |

TABLE 3B

| D | A | B | C |
|---|---|---|---|
| A | B | C | D |
| B | C | D | A |
| C | D | A | B |
| D | A | B | C |
| A | B | C | D |
| B | C | D | A |
| C | D | A | B |

TABLE 3C

| A | B | C | D |
|---|---|---|---|
| D | A | B | C |
| C | D | A | B |
| B | C | D | A |
| B | C | D | A |
| C | D | A | B |
| D | A | B | C |
| A | B | C | D |

In the embodiment of the present invention, the position conversions of four times of continuous data reading and writing of the memory are performed according to the arrangement of the table 3A.

Figures 3, 4:
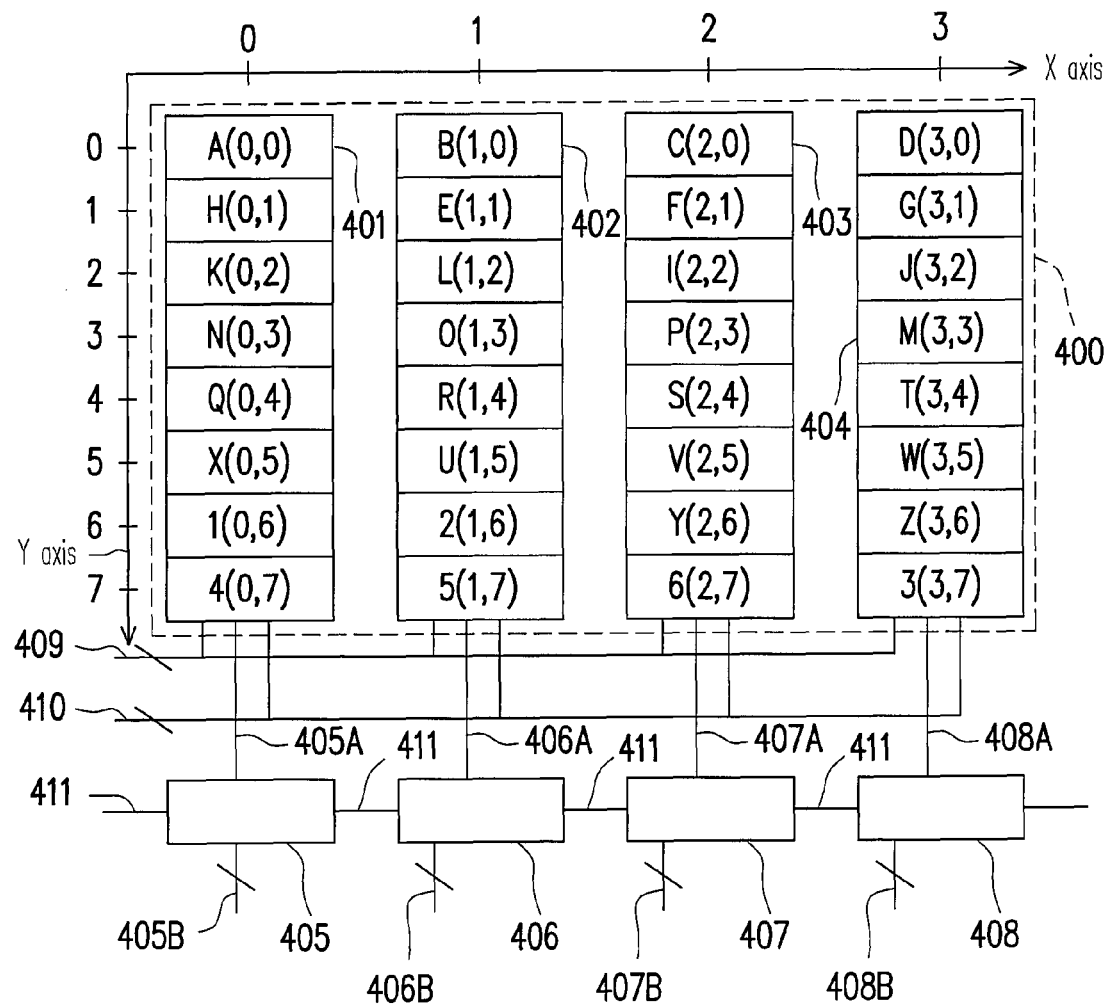
FIG. 3 is a display panel.
FIG. 4 is a related schematic view of a memory 400 corresponding to the display panel of FIG. 3 after the address conversion.
Figure 5:
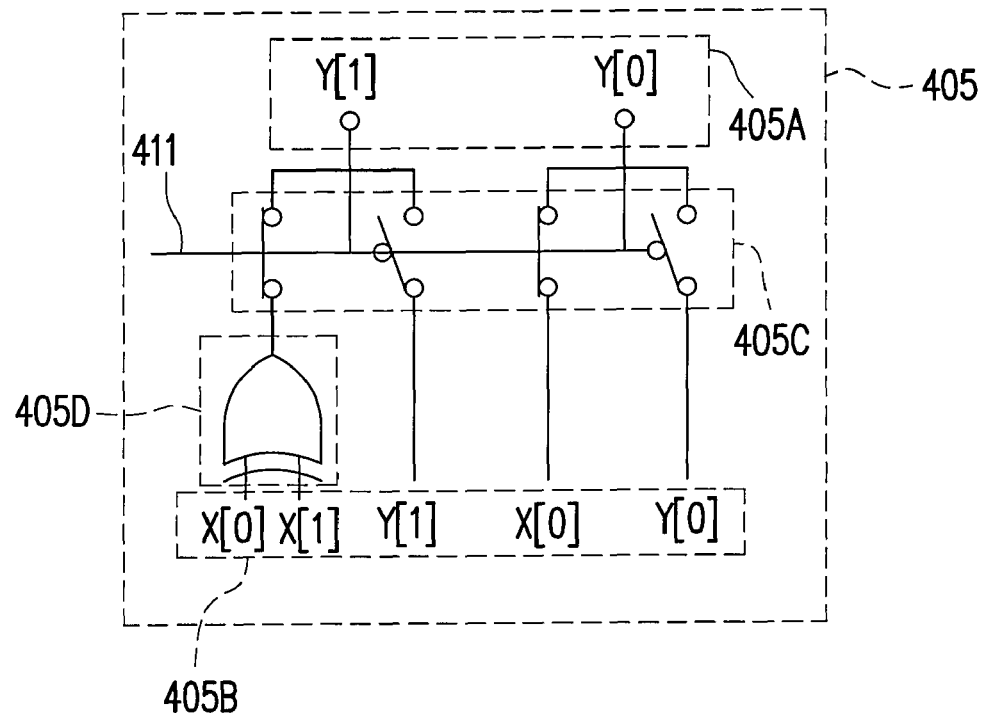
FIGS. 5-8 are circuit diagrams of position converters 405-408 in FIG. 4.
Figure 6:
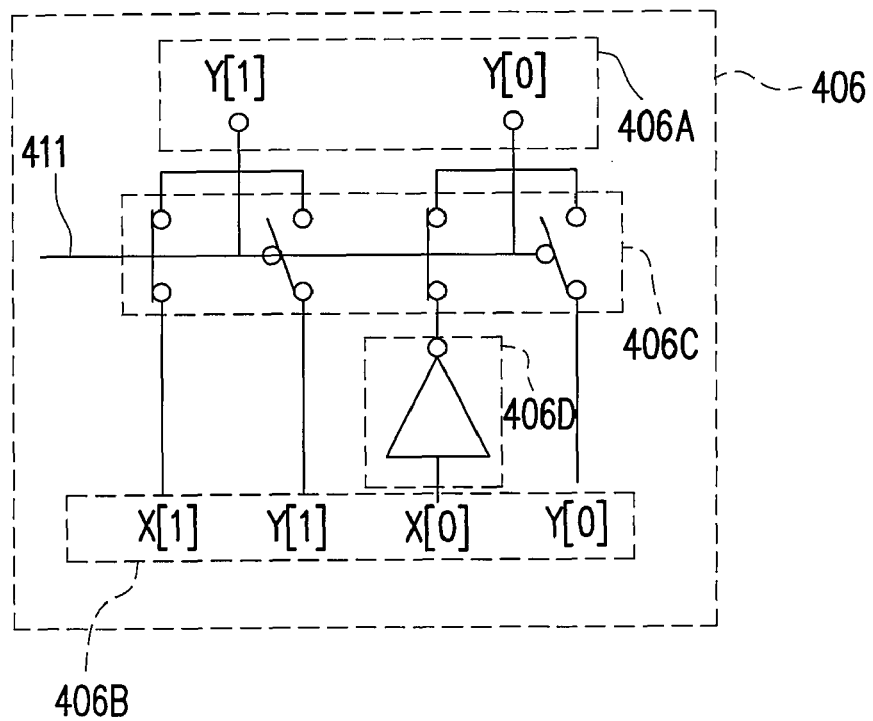
Figure 7:
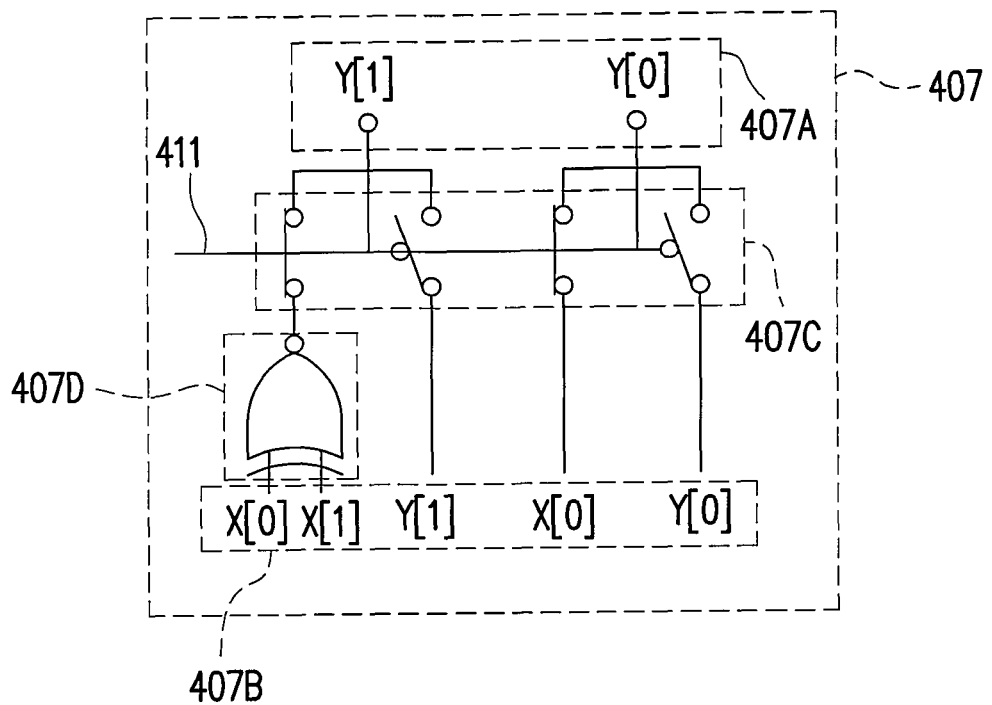
Figure 8:
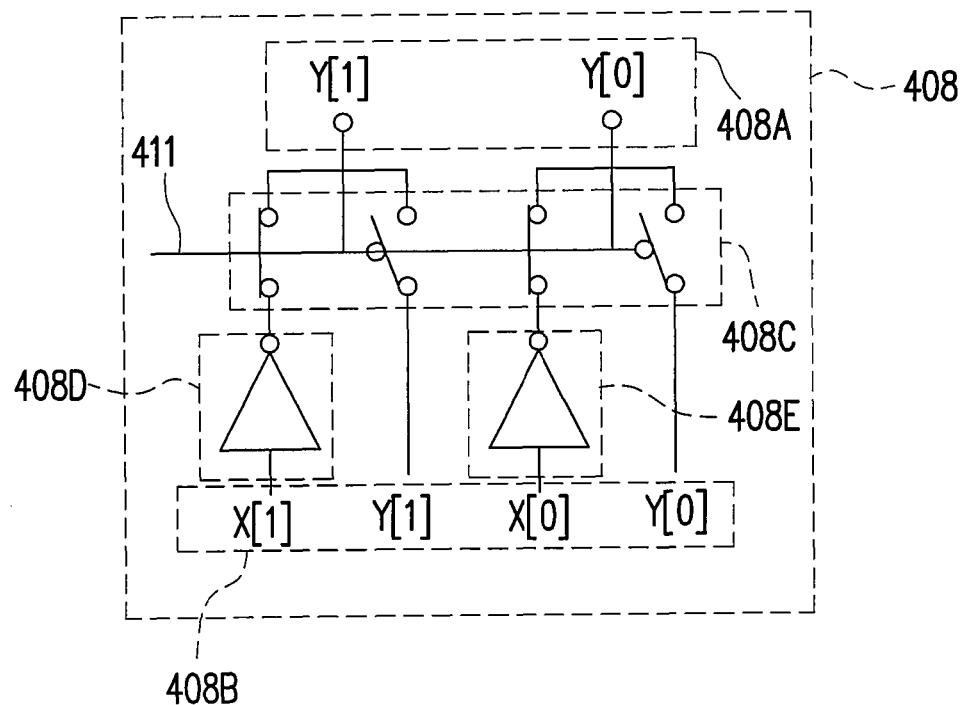

Next, for the second embodiment, it is required to continuously read and write four batches of data laterally or longitudinally to a memory connected to a display panel. FIG. 3 shows the display panel 300, and data addresses A-Z and 1-6 are serial data that represent the addresses of pixels in the display panel 300. FIG. 4 shows a related schematic view of a memory 400 corresponding to the display panel of FIG. 3 after the address conversion. Herein, A-D, E-H, I-L. M-P. Q-T, U-X, Y-2, and 3-6 are different serial parts of the serial data as shown in FIG. 3 and FIG. 4. Sub blocks 401-404 are four laterally divided sub blocks, data converters 405-408 are further provided, a signal 409 is of a value of Y[2], and a read and write data signal 410 is data in the read and write address. Read and write address signals 405B, 406B, 407B, and 408B of the external entity, and a longitudinal read and write signal 411 are input ends of the data converters. The output ends are Y axis shift values represented by signals 405A, 406A, 407A, and 408A, i.e., the value of Y[0:1]. Data addresses A-Z and 1-6 are addresses after the internal moving of the memory, and left and right numbers in brackets represent address coordinates of X axis and Y axis. The position conversion uses the arrangement of Table 3A.

Referring to Table 4, during lateral reading and writing, four batches of data are in the same Y coordinate in each sub block, so it is unnecessary to change the Y coordinates during reading and writing, and it is only necessary to move the X coordinate.

TABLE 4

| Read and write pixel | Address after address conversion of memory | Sub block 401 | Sub block 402 | Sub block 403 | Sub block 404 |
|---|---|---|---|---|---|
| ABCD | A(0,0) B(1,0) C(2,0) D(3,0) | A(0,0) | B(1,0) | C(2,0) | D(3,0) |
| EFGH | E(1,1) F(2,1) G(3,1) H(0,1) | H(0,1) | E(1,1) | F(2,1) | G(3,1) |
| IJKL | I(2,2) J(3,2) K(0,2) L(1,2) | K(0,2) | L(1,2) | I(2,2) | J(3,2) |
| MNOP | M(3,3) N(0,3) O(1,3) P(2,3) | N(0,3) | O(1,3) | P(2,3) | M(3,3) |

However, during longitudinal reading and writing, four batches of data are on different Y coordinates. Therefore, address lines of four sub blocks are respectively controlled by the controller. Alternatively, the address lines are generated by decoding, and it is realized by determining whether the Y coordinate transmits the converting value by a lateral/longitudinal control. Please refer to Table 4A.

TABLE 4A

| Read and write pixel | Address after address conversion of memory | Sub block 401 | Sub block 402 | Sub block 403 | Sub block 404 |
|---|---|---|---|---|---|
| AEIM | A(0,0) E(1,1) I(2,2) M(3,3) | A(0,0) | E(1,1) | I(2,2) | M(3,3) |
| QUY3 | Q(0,4) U(1,5) Y(2,6) 3(3,7) | Q(0,4) | U(1,5) | Y(2,6) | 3(3,7) |
| BFJN | B(1,0) F(2,1) J(3,2) N(0,3) | N(0,3) | B(1,0) | F(2,1) | J(3,2) |
| RVZ4 | R(1,4) V(2,5) Z(3,6) 4(0,7) | 4(0,7) | R(1,4) | V(2,5) | Z(3,6) |
| CGKO | C(2,0) G(3,1) K(0,2) O(1,3) | K(0,2) | O(1,3) | C(2,0) | G(3,1) |
| SW15 | S(2,4) W(3,5) 1(0,6) 5(1,7) | 1(0,6) | 5(1,7) | S(2,4) | W(3,5) |
| DHLP | D(3,0) H(0,1) L(1,2) P(2,3) | H(0,1) | L(1,2) | P(2,3) | D(3,0) |
| TX26 | T(3,4) X(0,5) 2(1,6) 6(2,7) | X(0,5) | 2(1,6) | 6(2,7) | T(3,4) |

In this example, the address lines of the four sub blocks are generated by decoding. FIGS. 5-8 respectively show circuit diagrams of the position converters 405-408 in FIG. 4. Read and write address signals 405B, 406B, 407B, and 408B are addresses of the external entity, the included X[1], X[0], Y[1], and Y[0] represent bit values of X axis and Y axis of the external input or output addresses, if the read and write pixel address is N(1, 3) in FIG. 3, X[1]=0, X[0]=1, Y[1]=1, and Y[0]=1. The longitudinal read and write control signal 411 respectively controls switch sets 405C, 406C, 407C, and 408C. 406D, 408D, and 408E represent inverters, 405D represents an exclusive OR gate, and 407D represents an exclusive NOR gate.

Figure 9:
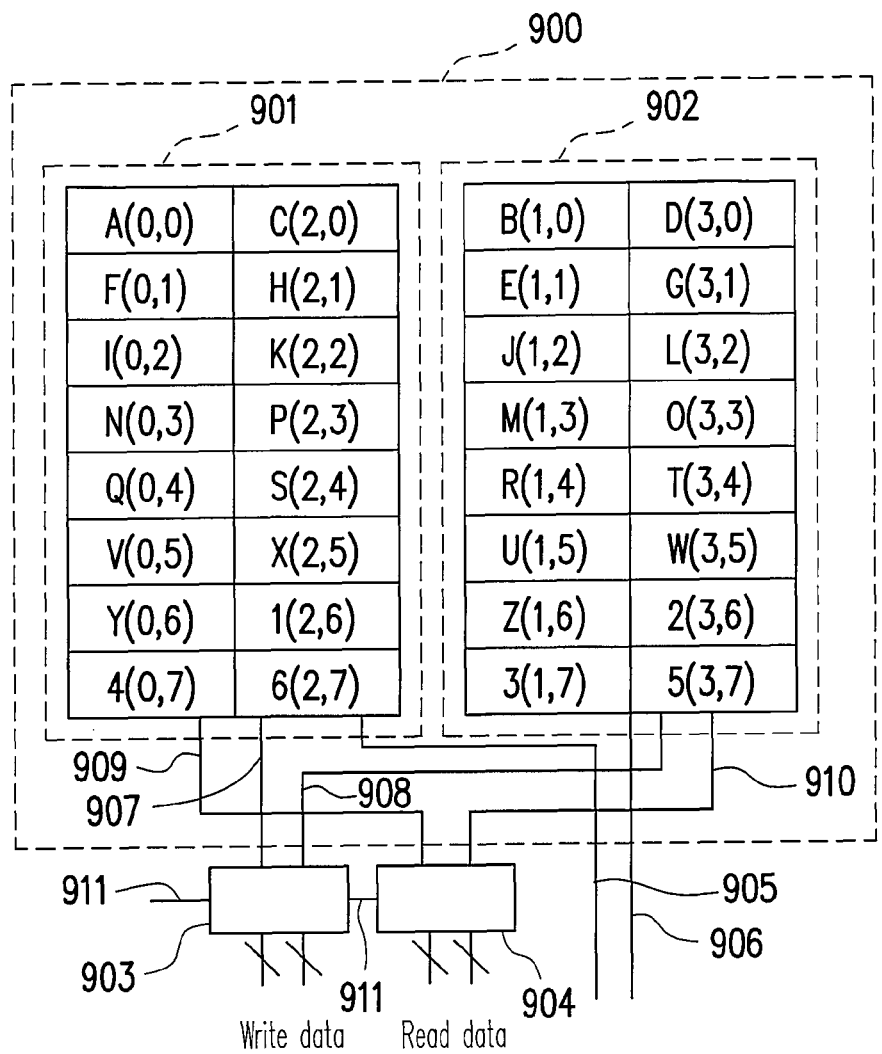
FIG. 9 is a related schematic view of a memory 900 corresponding to the display panel of FIG. 3 after the address conversion.

In the third embodiment, it is required to continuously read and write two batches of data laterally or longitudinally to a memory connected to a display panel. FIG. 3 shows the display panel 300, and data addresses A-Z and 1-6 represent the addresses of the display pixels. FIG. 9 shows a related schematic view of a memory 900 corresponding to the display panel of FIG. 3 after the address conversion. Sub blocks 901 and 902 are two laterally divided sub blocks, and data converters 903 and 904, a left end control signal 905, and a right end control signal 906 are further provided. 907 and 908 respectively represent writing data of the sub blocks 901 and 902, and 909 and 910 respectively represent reading data of the sub blocks 901 and 902. A signal 911 is of a value of Y[0], and it controls data converters 903 and 904, and also controls X[0] value of the right end control signal 906. The data addresses A-Z and addresses 1-6 are addresses after the internal moving of the memory, the numbers in the brackets represent X and Y axis values of the addresses.

Table 5 and Table 5A are situation of the data conversion and the control signal conversion. The situation of the data conversion and control conversion during writing is same as that during reading.

TABLE 5

| Read pixel | Address before address conversion of memory | Sub block 102 distribution position | Sub block 103 distribution position | Data read by sub block 102 a | Data read by sub block 103 | Data sent outwards by sub block 102 | Data sent outwards by sub block 103 |
|---|---|---|---|---|---|---|---|
| AB | A(0,0)B(1,0) | A(0,0) | B(1,0) | A | B | A | B |
| CD | C(2,0)D(3,0) | C(2,0) | D(3,0) | C | D | C | D |
| EF | E(0,1)F(1,1) | F(0,1) | E(1,1) | F | E | E*1 | F*1 |
| GH | G(2,1)H(3,1) | H(2,1) | G(3,1) | H | G | G*1 | H*1 |

*1 The data converter converts the read data according to Y[0] = 1

Figure 10:
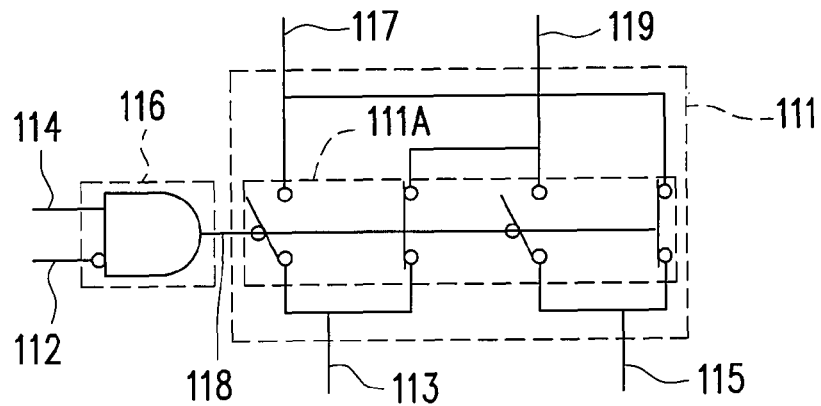
FIG. 10 is an inner circuit diagram of data converters 903 and 904 in FIG. 9.

FIG. 10 shows a circuit diagram of the data conversion control in this embodiment. A multiplexer 111 is a 2 to 2 multiplexer. Data lines 113 and 115 are data lines connected to the external entity position ends, data lines 117 and 119 are data lines connected to internal ends of the memory, a signal 112 is a longitudinal read and write control signal, and a signal 114 is of Y[0] value. An AND gate 116 outputs a signal 118 for controlling a switch set 111A. In this example, the position conversion is realized by inputting different addresses by the controller, and the data has been converted according to Y[0] value before being transmitted into the controller.

The above Table 5 shows the detailed lateral reading action. Here, it intends to firstly read a pixel AB, see A(0,0)B(1,0) in FIG. 3, Y axis values are 0, i.e., Y[0]=0, the sub block 901 reads the data A (0, 0), and the sub block 902 reads the data B(1, 0), and the data are sent to finish the reading.

According to FIG. 10, as being lateral, the signal 102 is 0, and as Y[0]=0, the signal 104 is 0, the data line 107 is the data A(0, 0) read by the sub block 901, and the data line 109 is the data B(1, 0) read by the sub block 902. The data line 103 sends the data A(0, 0) of the data line 107, and the data line 105 sends the data B(1, 0) of the data line 109.

When it intends to read a pixel CD, see C(2,0)D(3,0) in FIG. 3, Y axis value is 0, i.e., Y[0]=0, so the sub block 901 reads the data C(2, 0), the sub block 902 reads the data D(3, 0), and the data are sent to finish the reading.

According to FIG. 10, as being lateral, the signal 102 is 0, and as Y[0]=0, the signal 114 is 0, the data line 117 is the data C(2,0) read by the sub block 901, and the data line 119 is the data D(3,0) read by the sub block 902. The data line 113 sends the data C(2,0) of the data line 107, and the data line 105 sends the data D(3,0) of the data line 119.

When it intends to read a pixel EF, see E(0,1)F(1,1) in FIG. 3, Y axis value is 1, i.e., Y[0]=1, so the data F(0, 1) read by the sub block 901 can be exchanged with the data E(1, 1) read by the sub block 902.

According to FIG. 10, as being lateral, the signal 112 is 0, and as Y[0]=1, the signal 114 is 1, the data line 117 is the data F(0, 1) read by the sub block 901, and the data line 119 is the data E(1, 1) read by the sub block 902. The data line 113 sends the data E(1, 1), and the data line 115 sends the data F(0, 1).

When it intends to read a pixel GH, see G(2,1)H(3,1) in FIG. 3, Y axis value is 1, i.e., Y[0]=1, so the data H(2,1) read by the sub block 901 can be exchanged with the data G(3,1) read by the sub block 902. For the detailed illustration, please refer to FIG. 10 and Table 5, and it is not described repeatedly.

The above table 5A shows the detailed longitudinal reading action. Here, it intends to firstly read a pixel AE, see A(0,0) E(0,1) in FIG. 3, Y axis value of A is 0, i.e., Y[0]=0, the sub block 901 still reads the data A (0, 0), which is sent through the data converter 904. Y axis value of E is 1, i.e., Y[0]=1, the right end signal line 906 changes the X[0] value of E to E[1, 1] according to Y[0]=1, such that the sub block 902 reads the data E(1, 1), which is sent through the data converter 904 to finish the reading.

When it intends to read a pixel IM, see I(0,2)M(0,3) in FIG. 3, Y axis value of I is 2, i.e., Y[0]=0, the sub block 901 still reads the data I(0, 2) which is sent through the data converter 904. Y axis value of M is 3, i.e., Y[0]=1, the right end signal line 906 changes the X[0] value of M to M(1, 3) according to Y[0]=1, such that the sub block 902 reads the data M(1, 3), which is sent through the data converter 904 to finish the reading. Please refer to Table 5A and FIG. 10, the rest pixels can be deduced by analog, so it is not described repeatedly.

To sum up, in the present invention, the method for memory address arrangement is suitable adopted, and the data converters are well used to move the data of different Y coordinates to the operation units divided by different X coordinates, so as to simultaneously read and write a plurality of batches of lateral and longitudinal data, thereby expanding the reading and writing manner of the memory, and being more conveniently matched with the external software and hardware.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for memory address arrangement, for a memory to store a serial data representing addresses of pixels in a display panel, wherein the pixels is arranged in the display panel in a manner of array, the memory is coupled to a data converter and is laterally divided into N blocks, each of the N blocks comprises M longitudinal units, and N and M are natural numbers, the method for the memory address arrangement comprising:

laterally writing a serial part of the serial data into the memory from an $I^{th}$ longitudinal unit of a $P^{th}$ block of the memory in sequence by the data converter, wherein the number of the serial data is greater than N, wherein the serial part of the serial data corresponds to addresses of first pixels in the display panel, and the first pixels are located on a first row in the array; and laterally writing another serial part of the serial data following the part of the serial data into the memory from a

TABLE 5A

| Read pixel | Address before address conversion of memory | Sub block 102 distribution position | Sub block 103 distribution position | Data read by sub block 102 | Data read by sub block 103 | Data sent outwards by sub block 102 | Data sent outwards by sub block 103 |
| --- | --- | --- | --- | --- | --- | --- | --- |
| AE | A(0,0)E(0,1) | A(0,0) | E(1,1)*2 | A | E | A | E |
| IM | I(0,2)M(0,3) | I(0,2) | M(1,3)*2 | I | M | I | M |
| QU | Q(0,4)U(0,5) | Q(0,4) | U(1,5)*2 | Q | U | Q | U |
| Y3 | Y(0,6)3(0,7) | Y(0,6) | 3(1,7)*2 | Y | 3 | Y | 3 |

*2The control signal changes X[0] value of the right end control signal according to Y[0] = 1.

$J^{th}$ longitudinal unit of a $Q^{th}$ block of the memory in sequence by the data converter, wherein the $I^{th}$ longitudinal unit of the $P^{th}$ block and the $J^{th}$ longitudinal unit of the $Q^{th}$ block are located in different rows, and P, Q, I, and J are natural numbers;

the another serial part of the serial data corresponds to addresses of second pixels in the display panel, the second pixels are located on a second row in the array, and the second row is a next row after the first row; and P, Q, I, and J satisfy one of following two conditions:

(1) Q=P+1 and J=I+1, wherein P is smaller than N, Q is smaller than or equal to N, I is smaller than M, and J is smaller than or equal to M; and (2) P=N, Q=1, I=M, and J=1.

2. The method for memory address arrangement as claimed in claim 1, further comprising:

reading the serial data from each row of the blocks in sequence, wherein an address of reading the serial data is determined according to an address of writing the serial data.

3. The method for memory address arrangement as claimed in claim 2, wherein the serial data is read from each block by means of reading at least one row at a time.

4. The method for memory address arrangement as claimed in claim 1, wherein after at least N rows of data are written, two rows with the same initial block begin to appear.

5. The method for memory address arrangement as claimed in claim 1, wherein the serial data is written into each block by means of writing at least one row at a time.

6. The method for memory address arrangement as claimed in claim 1, wherein the serial data is an image data.

7. The method for memory address arrangement as claimed in claim 1, wherein the memory reads and writes the serial data in a manner of array.

8. The method for memory address arrangement as claimed in claim 1, wherein the memory is one of a static random access memory (SRAM), a dynamic random access memory (DRAM), and a flash memory.

9. A method for memory address arrangement, for a memory to store a serial data representing addresses of pixels in a display panel, wherein the memory is coupled to a data converter and is longitudinally divided into N blocks, each of the N blocks comprises M lateral units, and N and M are natural numbers, the method for the memory address arrangement comprising:

longitudinally writing a serial part of the serial data into the memory from an $I^{th}$ lateral unit of a $P^{th}$ block of the memory in sequence by the data converter, wherein the number of the serial data is greater than N, wherein the serial part of the serial data corresponds to addresses of first pixels in the display panel, and the first pixels are located on a first column in the array; and longitudinally writing another serial part of the serial data following the part of the serial data into the memory from a $J^{th}$ lateral unit of a $Q^{th}$ block of the memory in sequence by the data converter, wherein the $I^{th}$ lateral unit of the $P^{th}$ block and the $J^{th}$ lateral unit of the $Q^{th}$ block are located in different columns, and P, Q, I, and J are natural numbers;

the another serial part of the serial data corresponds to addresses of second pixels in the display panel, the second pixels are located on a second column in the array, and the second column is adjacent to the first column; and P, Q, I, and J satisfy one of following two conditions:

(1) Q=P+1 and J=I+1, wherein P is smaller than N, Q is smaller than or equal to N, I is smaller than M, and J is smaller than or equal to M; and (2) P=N, Q=1, I=M, and J=1.

10. The method for memory address arrangement as claimed in claim 9, further comprising:

reading the serial data from each column of the blocks in sequence, wherein an address of reading the serial data is determined according to an address of writing the serial data.

11. The method for memory address arrangement as claimed in claim 10, wherein the serial data is read from each block by means of reading at least one column at a time.

12. The method for memory address arrangement as claimed in claim 9, wherein after at least N columns of data are written, two columns with the same initial block begin to appear.

13. The method for memory address arrangement as claimed in claim 9, wherein the serial data is written into each block by means of writing at least one column at a time.

14. The method for memory address arrangement as claimed in claim 9, wherein the serial data is an image data.

15. The method for memory address arrangement as claimed in claim 9, wherein the memory reads and writes the serial data in a manner of array.

16. The method for memory address arrangement as claimed in claim 9, wherein the memory is one of a SRAM, a DRAM, and a flash memory.

* * * * *

UNITED STATES PATENT AND TRADEMARK OFFICE
CERTIFICATE OF CORRECTION

PATENT NO. : 8,245,010 B2  
APPLICATION NO. : 11/863642  
DATED : August 14, 2012  
INVENTOR(S) : Shang-I Liu Page 1 of 1

It is certified that error appears in the above-identified patent and that said Letters Patent is hereby corrected as shown below:

On the title page, item (73) Assignee change 'Novatek Microelectronics' to --Novatek Microelectronics Corp.--

Signed and Sealed this  
Twenty-seventh Day of November, 2012

David J. Kappos  
*Director of the United States Patent and Trademark Office*